(12) United States Patent
Iwai et al.

(10) Patent No.: US 12,176,675 B2
(45) Date of Patent: Dec. 24, 2024

(54) SEMICONDUCTOR LASER DEVICE

(71) Applicant: Mitsubishi Electric Corporation, Tokyo (JP)

(72) Inventors: Yuji Iwai, Tokyo (JP); Motoharu Miyashita, Tokyo (JP); Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 944 days.

(21) Appl. No.: 17/280,360

(22) PCT Filed: Jan. 10, 2019

(86) PCT No.: PCT/JP2019/000461
§ 371 (c)(1),
(2) Date: Mar. 26, 2021

(87) PCT Pub. No.: WO2020/144794
PCT Pub. Date: Jul. 16, 2020

(65) Prior Publication Data
US 2022/0037851 A1 Feb. 3, 2022

(51) Int. Cl.
*H01S 5/024* (2006.01)
*H01S 5/022* (2021.01)
(Continued)

(52) U.S. Cl.
CPC ............ *H01S 5/0237* (2021.01); *H01S 5/022* (2013.01); *H01S 5/02315* (2021.01); *H01S 5/02469* (2013.01); *H01S 5/02476* (2013.01)

(58) Field of Classification Search
CPC .... H01S 5/0237; H01S 5/022; H01S 5/02315; H01S 5/02469; H01S 5/02476;
(Continued)

(56) References Cited

U.S. PATENT DOCUMENTS 5,780,320 A * 7/1998 Kinoshita ............. H01S 5/0201
438/33
6,326,646 B1 * 12/2001 Baillargeon ........ H01S 5/02375
257/94
(Continued)

FOREIGN PATENT DOCUMENTS

CN 102064473 A 5/2011
CN 106384935 A 2/2017
(Continued)

OTHER PUBLICATIONS

An Office Action issued by the German Patent and Trademark Office on Sep. 21, 2023, which corresponds to German U.S. Appl. No. 17/280,360.3 and is related to U.S. Appl. No. 17/280,360; with English language translation.
(Continued)

*Primary Examiner* — Xinning(Tom) Niu
(74) *Attorney, Agent, or Firm* — Studebaker & Brackett PC

(57) ABSTRACT

A semiconductor laser device is configured so that, on at least one of the respective opposing surfaces of a semiconductor laser chip and a sub-mount and the respective opposing surfaces of the sub-mount and a heatsink, one or more treatment regions are provided where adhesion of a bonding material or bonding material used for their bonding is reduced, wherein the one or more treatment regions are placed to define, in a traveling direction of light, different coverages depending on a position in an array direction of multiple light emitting regions.

18 Claims, 9 Drawing Sheets

(51) Int. Cl.
*H01S 5/02315* (2021.01)
*H01S 5/0237* (2021.01)

(58) Field of Classification Search
CPC .. H01S 5/0234; H01S 5/4087; H01S 5/02355; H01S 5/024
See application file for complete search history.

(56) References Cited

U.S. PATENT DOCUMENTS

| | | | |
|---|---|---|---|
| 2005/0286592 A1* | 12/2005 | Shimada | H01S 5/024 372/50.12 |
| 2006/0215717 A1* | 9/2006 | Shigihara | B82Y 20/00 372/43.01 |
| 2011/0051766 A1* | 3/2011 | Reill | H01S 5/4031 372/45.01 |
| 2011/0075693 A1* | 3/2011 | Kuramochi | H01S 5/04256 372/44.01 |
| 2014/0334508 A1* | 11/2014 | Lauer | H01S 5/024 372/36 |
| 2016/0099543 A1* | 4/2016 | Kuramoto | H01S 5/0234 372/36 |
| 2016/0254639 A1 | 9/2016 | Watanabe | |
| 2017/0310081 A1 | 10/2017 | Lauer et al. | |

FOREIGN PATENT DOCUMENTS

| | | |
|---|---|---|
| EP | 0590232 A1 | 4/1994 |
| JP | S63-073584 A | 4/1988 |
| JP | H06-112596 A | 4/1994 |
| JP | 2004-047096 A | 2/2004 |
| JP | 2007-095736 A | 4/2007 |
| JP | 2008-258276 A | 10/2008 |
| JP | 2009-111230 A | 5/2009 |
| JP | 2013-211303 A | 10/2013 |
| JP | 2015-502051 A | 1/2015 |
| WO | 2014/184844 A1 | 11/2014 |
| WO | 2015/063973 A1 | 5/2015 |
| WO | 2018/142499 A1 | 8/2018 |

OTHER PUBLICATIONS

International Search Report issued in PCT/JP2019/000461; mailed Mar. 26, 2019.

An Office Action; "Notice of Reasons for Refusal", mailed by the Japanese Patent Office on Mar. 1, 2022, which corresponds to Japanese Patent Application No. 2020-565094 and is related to U.S. Appl. No. 17/280,360; with English language translation.

An Office Action issued by the State Intellectual Property Office of the People's Republic of China on Nov. 25, 2023, which corresponds to Chinese Patent Application No. Cn 201980082036.X with an English Translation.

An Office Action mailed by Taiwan Intellectual Property Office on Mar. 11, 2021, which corresponds to Taiwanese U.S. Appl. No. 17/280,360 and is related to U.S. Appl. No. 17/280,360; with English language translation.

An Office Action issused by Taiwan Intellectual Property Office on Jul. 15, 2021, which corresponds to Taiwanese Patent Application No. 108146156 and is related to U.S. Appl. No. 17/280,360 with English language translation.

An Office Action mailed by the Korean Intellectual Property Office on Apr. 28, 2022, which corresponds to Korean Patent Application No. 10-2021-7014618 and is related to U.S. Appl. No. 17/280,360; with English language translation.

An Office Action issued by Taiwan Intellectual Property Office on Sep. 2, 2022, which corresponds to Taiwanese Patent Application No. 108146156 and is related to U.S. Appl. No. 17/280,360; with English language translation.

An Office Action; "Notice of Reasons for Refusal," mailed by the Japanese Patent Office on Jan. 10, 2023, which corresponds to Japanese Patent Application No. 2022-069827 and is related to U.S. Appl. No. 17/280,360; with English language translation.

* cited by examiner

SEMICONDUCTOR LASER DEVICE

TECHNICAL FIELD

The present application relates to a semiconductor laser device.

BACKGROUND ART

In a device for displaying color images, such as, a projector device, a projection TV or the like, as its light sources, three-color light sources of R (Red), G (Green) and B (Blue) are required. As such a light source, a semiconductor laser device having a high luminous efficiency is used in some cases. Laser light has, because of its monochromaticity, a characteristic of causing the color gamut to be widened; however, because of its phase uniformity, the laser light is highly coherent, and this may cause appearance of a spot pattern on the projection screen, so-called a speckle noise.

In order to reduce the coherence, it is conceivable to concurrently generate other laser light having a wavelength that is different to the extent that their colors can be recognized to be the same by the human eye. Thus, it is conceivable to employ a technology of a semiconductor laser device in which multiple active layers with different specifications are formed on a single substrate to thereby generate rays of laser light with different wavelengths (see, for example, Patent Documents 1 and 2). However, formation of the multiple active layers with different properties causes complications in the device formation process. Thus, there is concern about a cost rise and a yield degradation.

In that respect, there is proposed a semiconductor laser device which has a heatsink on which active layers with the same specifications are arrayed, and in which, for the parts of the heatsink in contact with the active layers placed on both end sides in the array direction, a material is used that is higher in thermal conductivity than a material used for the part of the heatsink in contact with the active layer placed on the center side (see, for example, Patent Document 3). This configuration does not cause the complications in the device formation process, but causes, during operation, temperature differences between the active layer on the center side and the active layers on the both end sides, so that it is possible to generate rays of laser light with different wavelengths by using the active layer on the center side and the active layers on the both end sides.

CITATION LIST

Patent Document

Patent Document 1: Japanese Patent Application Laid-open No. 2004-47096 (Paragraphs 0025 to 0034; FIG. 3 to FIG. 6)

Patent Document 2: Japanese Patent Application Laid-open No. 2007-95736 (Paragraphs 0026 to 0037; FIG. 1 to FIG. 4)

Patent Document 3: Japanese National Republication of International Patent Application No. WO2015/063973 (Paragraphs 0020 to 0030; FIG. 3 to FIG. 5)

SUMMARY OF THE INVENTION

Problems to be Solved by the Invention

However, combining materials having different thermal conductivities to form such a member, results in a cost increase. In another aspect, even if the member could be formed inexpensively by using materials having different thermal conductivities, when the member is configured so that its thermal conductivity at the center side and that at the both end sides are different from each other, the active layers located at the same distance from the center will reach the same temperature, to thereby generate rays of laser light having the same wavelength. Namely, a part of the multiple active layers will generate rays of laser light having the same wavelength, so that the effect of reducing the coherence is poor.

This application discloses a technique for solving the problem as described above, and an object thereof is to achieve inexpensively and easily a semiconductor laser device which is highly effective for reducing the coherence.

Means for Solving the Problems

A semiconductor laser device disclosed in this application is characterized by comprising: a plate-like semiconductor laser chip in which multiple light emitting regions each extending along a traveling direction of light are arrayed in order in a direction perpendicular to the traveling direction, with an interval therebetween;

a sub-mount which is bonded to the semiconductor laser chip; and a heatsink which is bonded to the sub-mount on its side opposite to its side where the sub-mount is bonded to the semiconductor laser chip; wherein, on at least one of respective opposing surfaces of the semiconductor laser chip and the sub-mount and respective opposing surfaces of the sub-mount and the heatsink, one or more treatment regions are provided where adhesion of a bonding material used for their bonding is reduced, said one or more treatment regions being placed to define, in the traveling direction, different coverages depending on a position in an array direction of the multiple light emitting regions.

Further, another semiconductor laser device disclosed in this application is characterized by comprising: a plate-like semiconductor laser chip in which multiple light emitting regions each extending along a traveling direction of light are arrayed in order in a direction perpendicular to the traveling direction, with an interval therebetween; a sub-mount which is bonded to the semiconductor laser chip; and a heatsink which is bonded to the sub-mount on its side opposite to its side where the sub-mount is bonded to the semiconductor laser chip; wherein a thermal resistance in heat transfer paths that connect the respective multiple light emitting regions and the heatsink, monotonically decreases or mono-tonically increases as a position in an array direction of the multiple light emitting regions moves from one end side of that regions toward another end side thereof.

Effect of the Invention

According to the semiconductor laser device disclosed in this application, since the temperature varies along the array direction on a per-light-emitting-region basis, it is possible to achieve inexpensively and easily a semiconductor laser device which is highly effective for reducing the coherence.

MODES FOR CARRYING OUT THE INVENTION

Embodiment 1

Figure 1A:
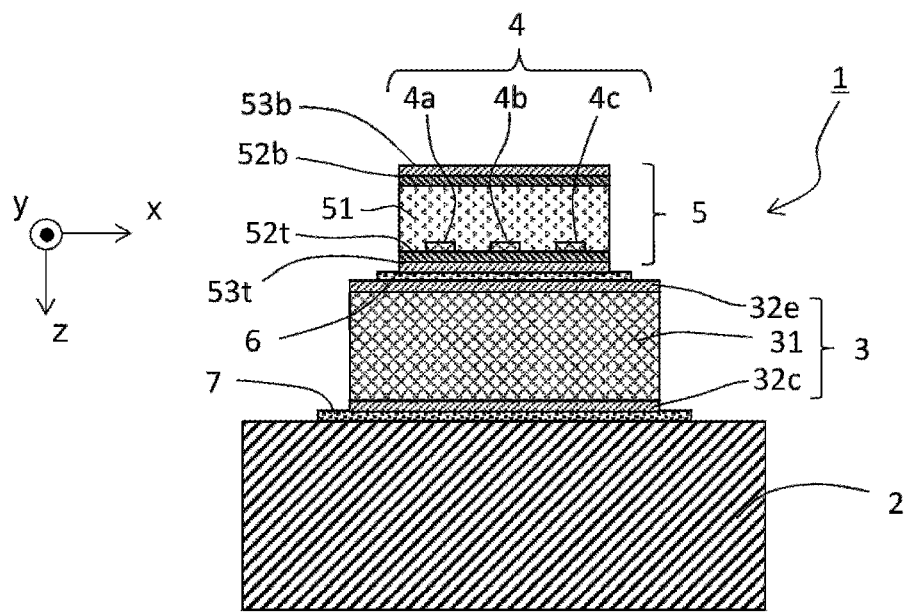
FIG. 1A to FIG. 1C are a sectional view of a semiconductor laser device perpendicular to a light traveling direction, a sectional view of a semiconductor laser chip perpendicular to the light traveling direction, and a plan view thereof showing treatment regions inside its opposing surface to a sub-mount, respectively, according to Embodiment 1.
Figure 1B:
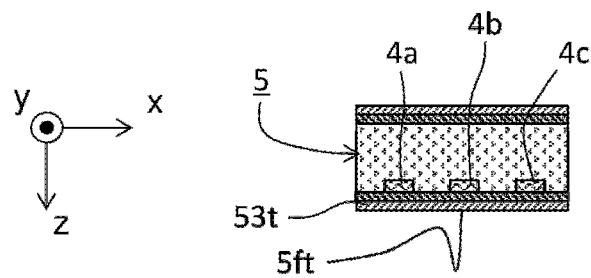
Figure 1C:
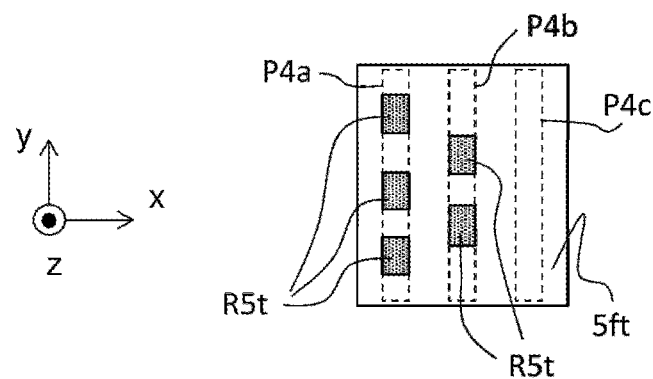
Figure 2A:
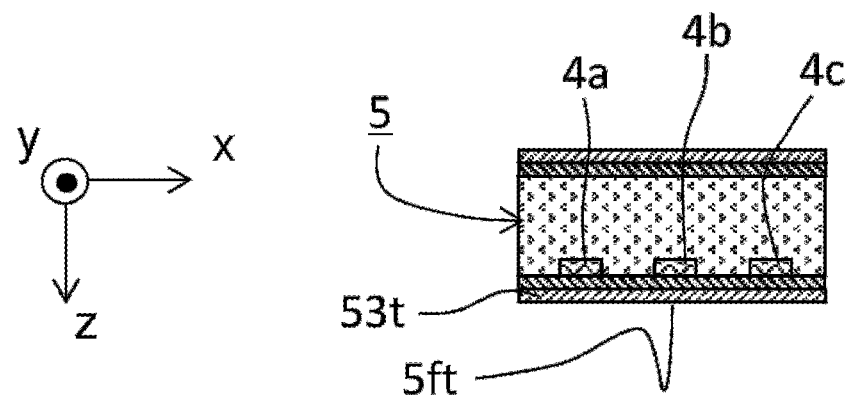
FIG. 2A and FIG. 2B are a sectional view, perpendicular to a light traveling direction, of a semiconductor laser chip that constitutes a semiconductor laser device, and a plan view thereof showing treatment regions inside its opposing surface to a sub-mount, respectively, according to a modified example of Embodiment 1.
Figure 2B:
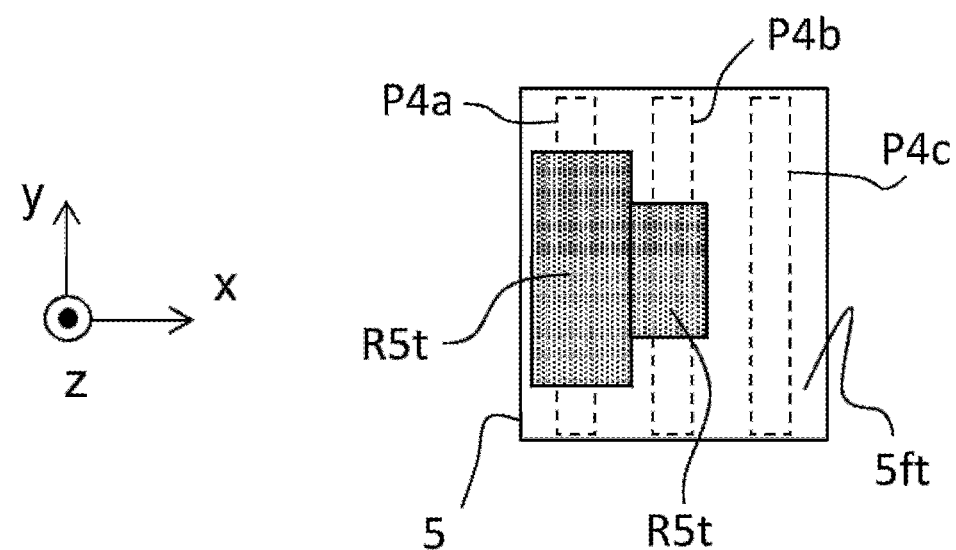

FIG. 1A, FIG. 1B and FIG. 2 serve to explain configurations of semiconductor laser devices according to Embodiment 1, in which FIG. 1A and FIG. 1B shows a sectional view of a semiconductor laser device perpendicular to a light traveling direction (FIG. 1A), a sectional view of a semiconductor laser chip perpendicular to the light traveling direction (FIG. 1B), and a plan view of the semiconductor laser chip showing treatment regions provided on its opposing surface to a sub-mount and having been subjected to surface treatment so as to cause a bonding material not to adhere thereto (FIG. 1C). Further, FIG. 2A and FIG. 2B shows as illustrations of a modified example: a sectional view, corresponding to FIG. 1B, of a semiconductor laser chip perpendicular to a light traveling direction (FIG. 2A); and a plan view, corresponding to FIG. 1C, of the semiconductor laser chip showing treatment regions provided on its opposing surface to a sub-mount and having been subjected to surface treatment so as to cause the bonding material not to adhere thereto (FIG. 2B). Note that, herein and also in subsequent Embodiments, description will be made assuming that, in the figures, the traveling direction of light in the semiconductor laser is a y-direction, an array direction in which multiple active layers each extending in the light traveling direction are arrayed is an x-direction, and a stacked direction of semiconductor layers is a z-direction.

As shown in FIG. 1A, a semiconductor laser device 1 is configured such that a sub-mount 3 and a heatsink 2 are successively stacked on a semiconductor laser chip 5 on the side of its upper electrode 52$t$ provided with multiple active layers 4$a$ to 4$c$ (referred to collectively as an active-layer group 4) formed thereon.

The semiconductor laser chip 5 is configured so that a stack 51 in which semiconductor layers (details thereof are omitted here) each extending along the light traveling direction (y-direction) are stacked, is sandwiched between a lower electrode 52$b$ and the upper electrode 52$t$. In the stack 51, at its lowermost surface (on the lower electrode 52$b$-side), a GaAs substrate having (001) plane as a principle plane, for example, is located, and beginning at that substrate, cladding layers, the active-layer group 4 that forms a quantum well, and the like, have been formed by crystal growth, etching, etc. so as to have prescribed shapes. Thus, in this application, using the direction of crystal growth as a reference, the electrode placed on the upper side in the figure is referred to as the lower electrode 52$b$, and the electrode placed on the lower side therein is referred to as the upper electrode 52$t$. The upper electrode 52$t$ and the lower electrode 52$b$ are each formed of, for example, a metal as an electrically conductive material, such as, Au, Ge, Zn, Pt, Ti or the like, in order to cause a current to flow therethrough from the outside. Furthermore, on the outer side of them, plating layers 53$t$, 53$b$ are formed for their bonding to the other members or for their surface protection. Note that both end facets of the stack 51 located in the light traveling direction are formed by cleavage, for example.

It is noted that the crystal growth is achieved by, for example, a Metal Organic Chemical Vapor Deposition (MOCVD) method; however, this is not limitative, and it may, of course, be achieved by a variety of other methods. On the other hand, the three active layers 4$a$ to 4$c$ that constitute the active-layer group 4 have the same specifications and each form a stripe shape extending in the light traveling direction (y-direction), and are arranged in a direction (x-direction) that is perpendicular to the light traveling direction (y-direction) and the stacked direction of the stack 51 (z-direction), with equal intervals therebetween. The active layers 4$a$ to 4$c$ each constitute, between its both end facets formed by cleavage, a stripe-shaped resonator, so that light produced by current injection through the upper electrode 52$t$ and the lower electrode 52$b$ is amplified in the resonator, resulting in laser oscillation. Thus, the region of each of the active layers 4$a$ to 4$c$ serves as a light emitting region that is also referred to as a stripe-shaped light emitting region. Although the resonator length is set to from 150 μm to 300 μm in many cases, it is not limited to in this range.

The sub-mount 3 is a heat transfer member in which metallization layers 32e, 32c are formed on both sides of a base member 31 such as, for example, an AlN (Aluminum Nitride)-sintered compact. Further, the heatsink 2 is a heat dissipation component formed of Cu (copper), Al (Aluminum) or the like. Further, with respect to the semiconductor laser chip 5, its side provided with the upper electrode 52t on which the active-layer group 4 is located, is opposed and fixed to the metallization layer 32e of the sub-mount 3 by means of a bonding material 6 such as a solder. With respect to the sub-mount 3, the metallization layer 32c that is formed on its side opposite to the metallization layer 32e formed on its side provided with an opposing surface 3fe (FIG. 3) to the semiconductor laser chip 5, is opposed and fixed to the heatsink 2 by means of a bonding material 7 such as a solder.

Here, in Embodiment 1, as shown in FIG. 1B and FIG. 1C, treatment regions R5t having been subjected to surface treatment so as to cause the bonding material 6 not to adhere thereto, are formed partially on an opposing surface 5ft of the semiconductor laser chip 5 to the sub-mount 3. The treatment regions R5t are created corresponding to projected regions P4a to P4c of the respective active layers 4a to 4c on the opposing surface 5ft. The projected regions are also regions located just above the respective active layers 4a to 4c, so that the regions P4a to P4c subject to creation of the treatment regions R5t are regions through which straight lines pass which connect the respective active layers 4a to 4c and the heatsink 2 with the shortest distance.

Of these regions P4a and P4b, for the region P4a corresponding to the active layer 4a, treatment regions R5t are arranged dispersedly at three spots in the traveling direction, and for the region P4b corresponding to the active layer 4b, treatment regions R5t are arranged dispersedly at two spots in the traveling direction. Further, for the region P4c corresponding to the active layer 4c, no treatment region R5t is arranged. Namely, the arrangement of the treatment regions R5t is adjusted so that a relationship represented by P4a>P4b>P4c is satisfied in terms of areas (or, coverages in the light traveling direction) defined by the treatment regions R5t.

Further, assuming for example a case where an AuSn (gold-tin) solder is used as the bonding material 6, a portion of the plating layer 53t other than its portions corresponding to the treatment regions R5t is formed by Au plating, and the portions corresponding to the treatment regions R5t are formed by Ni (nickel) plating. When the semiconductor laser chip 5 having the treatment regions R5t as described above, is bonded using the bonding material 6 to the sub-mount 3, at the portion other than those corresponding to the treatment regions R5t, the bonding material 6 mediates between the sub-mount 3 and the opposing surface 5ft to thereby establish heat transfer paths in a firm state. In contrast, since the AuSn solder is not wettable to Ni, at the portions corresponding to the treatment regions R5t, no bonding relation is established between the opposing surface 5ft and the bonding material 6 (after being hardened), resulting in their state merely in contact with each other. Depending on conditions, there is also a possibility that, at any place on the portions corresponding to the treatment regions R5t, a gap may occur between that portion and the bonding material 6.

Description will be made about operations of the thus-configured semiconductor laser device 1. When a current is injected through the upper electrode 52t and the lower electrode 52b into the semiconductor laser chip 5, laser light is emitted from the end facet of each of the active layers 4a to 4c. On this occasion, heat is generated in each of the active layers 4a to 4c to cause temperature rise; however, because the temperature difference between the layer and the heatsink 2 that is caused due to temperature rise, serves as driving force, heat is dissipated to the heatsink 2, namely, heat is deprived (cooled). Such temperature rise continues until an amount of heat generated in the respective active layers 4a to 4c is balanced with an amount of heat deprived due to heat dissipation, and when it is balanced, the temperature becomes stable.

In this situation, with respect to heat dissipation from the respective active layers 4a to 4c toward the heatsink 2, such paths that pass through the regions P4a to P4c are each a shortest path to the heatsink 2. However, as described previously, in the regions P4a, P4b, P4c corresponding to the respective active layers 4a, 4b, 4c and each positioned in the shortest path, the bonded areas to the bonding material are different from each other because of the arrangement of the treatment regions R5t. At the portion where the treatment region R5t is arranged, no bonding is provided between the opposing surface 5ft and the bonding material 6, so that the thermal resistance is higher than in the case where bonding is provided therebetween. Namely, the treatment region R5t functions as a disruption region that disrupts the heat transfer path from one of the active layers 4a to 4c to the heatsink 2.

Of course, there are heat transfer paths each bypassed through a portion which is outside the treatment region R5t and where bonding is established between the opposing surface 5ft and the bonding material 6; however, in the case of such paths, the path length becomes longer and thus, the thermal resistance also becomes higher. When the thermal resistance becomes higher, the temperature difference increases that is necessary for making the amount of generated heat balanced with the amount of heat deprived due to heat dissipation. Namely, the larger the area of arranged treatment region(s) R5t, the higher the thermal resistance becomes (the lower the heat dissipation capability becomes) and thus the higher the temperature becomes. Conversely, the smaller the area of the arranged treatment region(s) R5t becomes and thus the lower the thermal resistance becomes (the higher the heat dissipation capability becomes), the lower the temperature is maintained.

With respect to areas where bonding between the opposing surface 5ft and the bonding material 6 is prevented by the treatment regions R5t, the allocated area is ranked in descending order as "active layer 4a", "active layer 4b" and "active layer 4c", and the degree of heat dissipation is ranked in descending order as "active layer 4c", "active layer 4b" and "active layer 4a". Therefore, a relationship represented by active layer 4c<active layer 4b<active layer 4a, is satisfied in terms of the temperature during operation, so that the temperature of the active layer 4a becomes highest. Semiconductor lasers have characteristics that their oscillation wavelengths become longer as the temperature becomes higher. Thus, when the active layers 4a to 4c are compared with each other, the length of the wavelength is ranked in descending order as "active layer 4a", "active layer 4b" and "active layer 4c". In this manner, different oscillation wavelengths can be obtained from the respective active layers 4a to 4c, and this makes it possible to efficiently reduce the coherence.

Note that, it is not always required that the treatment regions R5t be arranged to fall within the regions P4a to P4c as shown in FIG. 1C. For example, portions of them may go out of the regions P4a to P4c, like in the modified example represented by FIG. 2A and FIG. 2B. Furthermore, it is allowed that the treatment regions R5$t$ are not dispersed in one of the regions P4$a$ to P4$c$, and thus, one unified treatment region is arranged in that region. Instead, they may be arranged like dots or in a patchy pattern. Even in these cases, it suffices to make the respective areas in the regions P4$a$ to P4$c$, where the treatment regions R5$t$ are arranged, different from each other.

Further, in the above example, a case is shown where an AuSn solder is used as the bonding material 6, the portion of the plating layer 53$t$ other than portions thereof corresponding to the treatment regions R5$t$ is formed by Au plating, and the portions corresponding to the treatment regions R5$t$ are formed by Ni plating; however, this is not limitative. For example, a metal film of Al (aluminum) or the like to which the solder does not adhere, or an insulating film based on Si (silicon) or the like, may be provided of each of the treatment regions R5$t$, and the other region may be provided with Cu (copper) instead of Au.

Furthermore, for example, in the case where a so-called resin-based adhesive, such as of an epoxy resin, is used as the bonding material 6, it is allowed to make the surface roughness in the region other than the treatment regions R5$t$ higher than that in the treatment regions R5$t$, to thereby make the bonding material 6 not to adhere to the treatment regions. Note that, also in the subsequent Embodiments, easily imaginable expressions of "not adhere", "not bondable" and "not wettable" will be used; however, even in the case corresponding to "less adhesive", "less bondable" or "less wettable", the thermal resistance will increase substantially. Accordingly, in the subsequent Embodiments, the written words of "not adhere", "not bondable" and "not wettable" may instead be read as "less adhesive", "less bondable" and "less wettable", respectively. Namely, so long as such a material or surface condition is ensured in the treatment region R5$t$ that is less adhesive, less bondable or less wettable to the bonding material 6 than that in the other region, the combination of the material, the surface condition, and the type of the bonding material 6 may be determined arbitrarily.

Embodiment 2

In the above Embodiment 1, a case has been described where, in order to make the temperatures of the respective active layers during operation different from each other, the regions to which the bonding material does not adhere are provided on the opposing surface of the semiconductor laser chip to the sub-mount. In Embodiment 2, a case will be described where the regions to which the bonding material does not adhere are provided on the opposing surface of the sub-mount to the semiconductor laser chip.

Figure 3A:
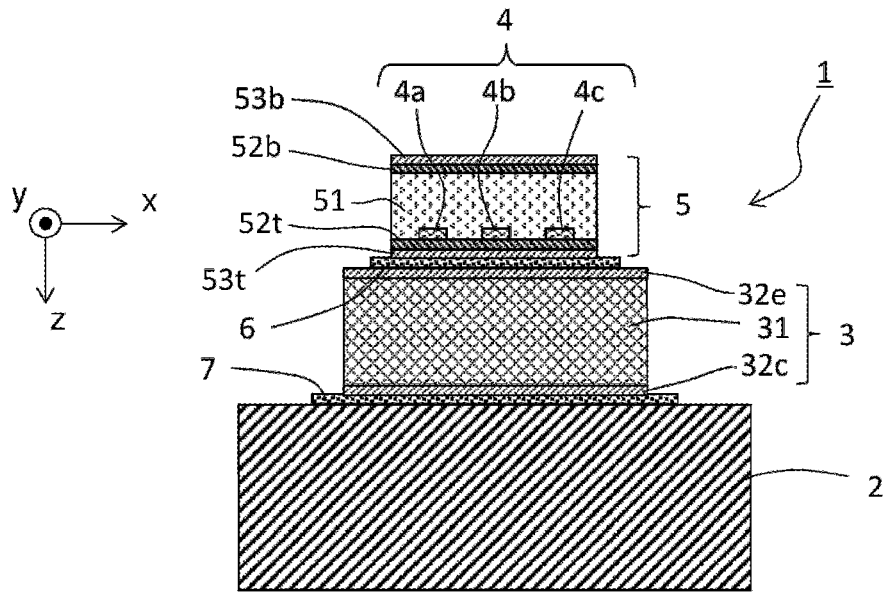
FIG. 3A to FIG. 3C are a sectional view of a semiconductor laser device perpendicular to a light traveling direction, a plan view of a sub-mount showing treatment regions inside its opposing surface to a semiconductor laser chip, and a sectional view thereof perpendicular to the light traveling direction, respectively, according to Embodiment 2.
Figure 3B:
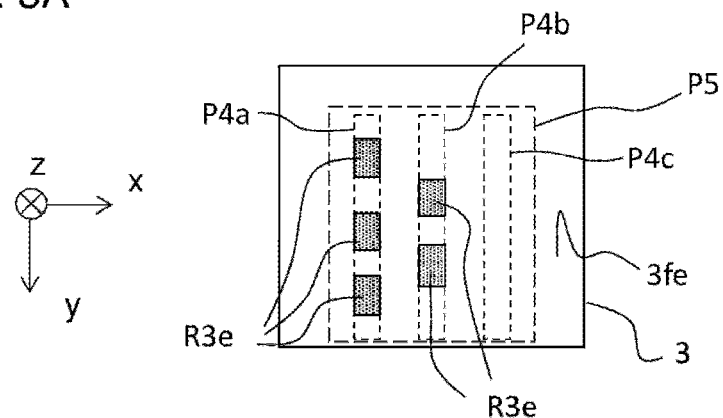
Figure 3C:
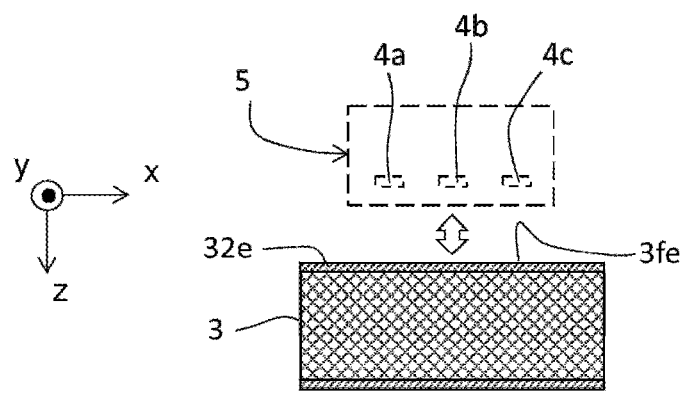
Figure 4A:
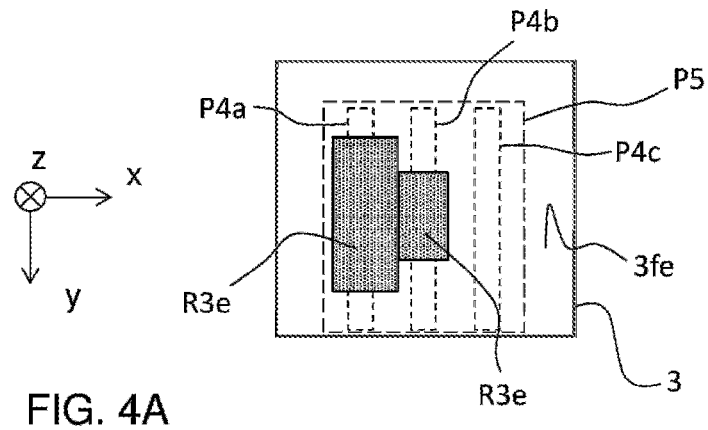
FIG. 4A and FIG. 4B are a plan view of a sub-mount that constitutes a semiconductor laser device, showing treatment regions inside its opposing surface to a semiconductor laser chip, and a sectional view thereof perpendicular to a light traveling direction, respectively, according to a modified example of Embodiment 2.
Figure 4B:
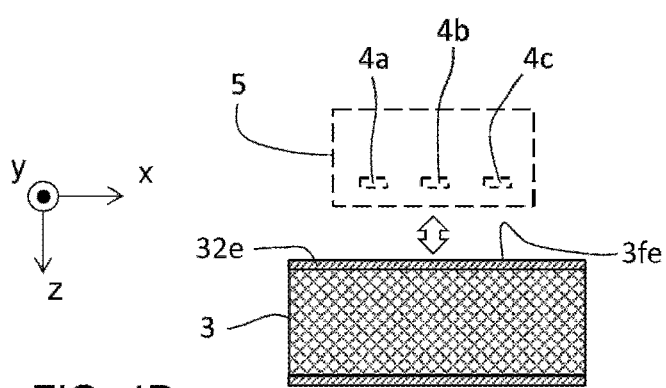

FIG. 3A to FIG. 3C serve to explain a configuration of a semiconductor laser device according to Embodiment 2, in which FIG. 3A is a sectional view of the semiconductor laser device perpendicular to a light traveling direction (corresponding to FIG. 1A), FIG. 3B is a plan view of a sub-mount showing treatment regions created on its opposing surface to the semiconductor laser chip and having been subjected to surface treatment so as to cause a bonding material not to adhere thereto, and FIG. 3C is a sectional view of the sub-mount perpendicular to the light traveling direction. Further, FIG. 4A and FIG. 4B shows as illustrations of a modified example: a plan view, corresponding to FIG. 3B, of the sub-mount (FIG. 4A) showing treatment regions created on its opposing surface to a semiconductor laser chip and having been subjected to surface treatment so as to cause a bonding material not to adhere thereto; and a sectional view, corresponding to FIG. 3C, of the sub-mount (FIG. 4B) perpendicular to the light traveling direction.

It is noted that, in the semiconductor laser devices according to Embodiment 2 and the subsequent Embodiments, the semiconductor laser chips themselves, as well as the heatsinks, have the same configurations other than how the surface treatment was applied thereto. Further, with respect also to the other members (sub-mount, bonding materials), for the part that is the same as the other, description will be omitted.

Also in the semiconductor laser device 1 according to Embodiment 2, as shown in FIG. 3A, a semiconductor laser chip 5 is fixed to a sub-mount 3 by means of a bonding material 6 such as a solder, and the sub-mount 3 is fixed to a heatsink 2 by means of a bonding material 7 such as a solder. Here, as shown in FIG. 3B and FIG. 3C, treatment regions R3$e$ having been subjected to surface treatment so as to cause the bonding material 6 not to adhere thereto, are formed partially on a metallization layer 32$e$ that constitutes an opposing surface 3$fe$ of the sub-mount 3 to the semiconductor laser chip 5. Within the opposing surface 3$fe$, the treatment regions R3$e$ are created corresponding to projected regions P4$a$ to P4$c$ of the respective active layers 4$a$ to 4$c$ on that surface after the semiconductor chip 5 being bonded. The regions P4$a$ to P4$c$ on the opposing surface 3$fe$ are also regions through which straight lines pass which connect the respective active layers 4$a$ to 4$c$ and the heatsink 2 with the shortest distance.

Of these regions P4$a$ and P4$b$, for the region P4$a$ corresponding to the active layer 4$a$, treatment regions R3$e$ are arranged dispersedly at three spots in the traveling direction, and for the region P4$b$ corresponding to the active layer 4$b$, treatment regions R3$e$ are arranged dispersedly at two spots in the traveling direction. Further, for the region P4$c$ corresponding to the active layer 4$c$, no treatment region R3$e$ is arranged. Namely, the arrangement of the treatment regions R3$e$ is adjusted so that a relationship represented by P4$a$>P4$b$>P4$c$ is satisfied in terms of areas defined by the treatment regions R3$e$.

Further, assuming for example a case where an AuSn (gold-tin) solder, as shown as an example in Embodiment 1, is used as the bonding material 6, the surface of a portion of the metallization layer 32$e$ other than its portions corresponding to the treatment regions R3$e$ is covered with Au, and the surfaces of the portions corresponding to the treatment regions R3$c$ are covered with Ni. When the semiconductor laser chip 5 is bonded, using the bonding material 6, to the sub-mount 3 having the treatment region R3$e$ as described above, at the portion other than those corresponding to the treatment regions R3$e$, the bonding material 6 mediates between the semiconductor laser chip 5 and the opposing surface 3$fe$ to thereby establish heat transfer paths in a firm state. In contrast, since the AuSn solder is not wettable to Ni, at the portions corresponding to the treatment regions R3$e$, no bonding relation is established between the opposing surface 3$fe$ and the bonding material 6 (after being hardened), resulting in their state merely in contact with each other. Depending on conditions, there is also a possibility that, at any place on the portions corresponding to the treatment regions R3$e$, a gap may occur between that portion and the bonding material 6.

When the thus-configured semiconductor laser device 1 is operated, the respective active layers 4$a$ to 4$c$ generate heat as described in Embodiment 1, and with respect also to heat dissipation toward the heatsink 2, such paths that pass through the regions P4$a$ to P4$c$ on an opposing surface 3$fc$ are each the shortest path to the heatsink 2. Further, also in this Embodiment, the treatment region R3e functions as a disruption region that disrupts a heat transfer path from one of the active layers 4a to 4c to the heatsink 2.

Further, with respect to areas where bonding between the opposing surface 3fe and the bonding material 6 is prevented by the treatment regions R3e, the allocated area is ranked in descending order as "active layer 4a", "active layer 4b" and "active layer 4c", and the degree of heat dissipation is ranked in descending order as "active layer 4c", "active layer 4b" and "active layer 4a". Therefore, like in Embodiment 1, a relationship represented by active layer 4c<active layer 4b<active layer 4a, is satisfied in terms of the temperature during operation, so that the temperature of the active layer 4a becomes highest. Thus, the length of the wavelength is ranked in descending order as "active layer 4a", "active layer 4b" and "active layer 4c". In this manner, different oscillation wavelengths can be obtained from the respective active layers 4a to 4c, and this makes it possible to efficiently reduce the coherence.

Note that, it is not always required that the treatment regions R3e be arranged to fall within the regions P4a to P4c as shown in FIG. 3B. For example, portions of them may go out of the regions P4a to P4c, like in the modified example represented by FIG. 4A and FIG. 4B. Furthermore, it is allowed that the treatment regions R3e are not dispersed in one of the regions P4a to P4c, and thus, one unified treatment region is arranged in that region. Instead, they may be arranged like dots or in a patchy pattern. Even in these cases, it suffices to make the respective areas in the regions P4a to P4c, where the treatment regions R3e are arranged, different from each other.

Furthermore, when such treatment regions are used together with the treatment regions R5t applied to the opposing surface 5ft as described in Embodiment 1, at their corresponding portions, the bonding material 6 may be sandwiched between members to which the bonding material 6 does not adhere. In this case, depending on the bonding conditions, an instance may arise where a part of the bonding material 6 sandwiched between the treatment region R5t and the treatment region R3e (between portions opposite to each other and similarly subjected to surface treatment) is lost to create a space, so that the thermal resistance becomes much higher and thus, the temperature difference can be made more significant.

Further, in the above example, a case is shown where an AuSn solder is used as the bonding material 6, the surface of the portion of the metallization layer 32e other than portions thereof corresponding to the treatment regions R3e is made of Au, and the surfaces of the portions corresponding to the treatment regions R3e are formed of Ni; however, this is not limitative. For example, an Al film or an insulating film based on Si or the like, may be provided on each of the treatment regions R3e, and the other region may be provided with Cu instead of Au. Furthermore, the surface roughness in the treatment regions R3e may be made different from that in the other region. Namely, also in Embodiment 2, so long as such a material or surface condition is ensured in the treatment region R3e, unlike in the other region, that causes the bonding material 6 not to adhere or causes the bonding material 6 not to be bonded to that region, the combination of the material, the surface condition, and the type of the bonding material 6 may be determined arbitrarily.

Embodiment 3

Figure 5:
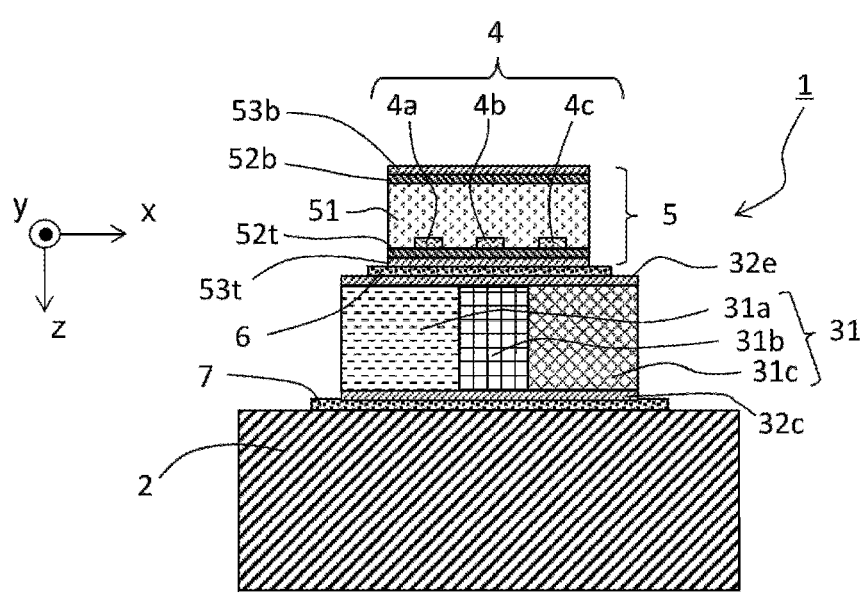
FIG. 5 is a sectional view of a semiconductor laser device perpendicular to a light traveling direction, according to Embodiment 3.
Figure 6:
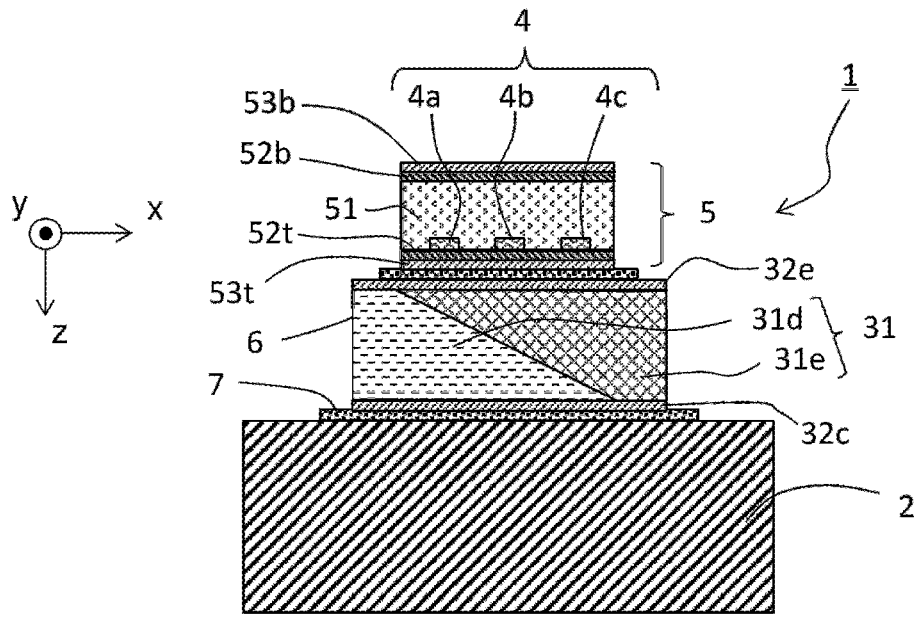
FIG. 6 is a sectional view of a semiconductor laser device perpendicular to a light traveling direction, according to a modified example of Embodiment 3.

In the above Embodiment 1 or 2, a case has been described where, in order to make the temperatures of the respective active layers during operation different from each other, the regions to which the bonding material does not adhere are provided at a position from the semiconductor laser chip to the sub-mount. In Embodiment 3, a case will be described where a sub-mount having a base member with different thermal conductivity in the array direction, is used. FIG. 5 and FIG. 6 serve to explain configurations of semiconductor laser devices according to Embodiment 3, in which FIG. 5 is a sectional view of a semiconductor laser device perpendicular to a light traveling direction (corresponding to FIG. 1A), and FIG. 6 is a sectional view of a semiconductor laser device perpendicular to a light traveling direction (ditto) according to a modified example.

Also in the semiconductor laser device 1 according to Embodiment 3, as shown in FIG. 5, a semiconductor laser chip 5 is fixed to a sub-mount 3 by means of a bonding material 6 such as a solder, and the sub-mount 3 is fixed to a heatsink 2 by means of a bonding material 7 such as a solder. Here, the sub-mount 3, as a characteristic configuration in Embodiment 3, uses a base member 31 in which partial base members 31a to 31c having different properties are arrayed side by side in the array direction of the active layers 4a to 4c. The partial base members 31a to 31c each form a rectangular parallelepiped in which the sectional shape shown in the figure continues along the light traveling direction (y-direction) and are, like in other Embodiments, sandwiched between a metallization layer 32e and a metallization layer 32c.

The partial base members are placed so that a straight line which connects the active layer 4a and the heatsink 2 passes through the partial base member 31a, a straight line which connects the active layer 4b and the heatsink 2 passes through the partial base member 31b, and a straight line which connects the active layer 4c and the heatsink 2 passes through the partial base member 31c. Further, the partial base members 31a to 31c are composed respectively of AlN sintered compacts having different porosities, and in the base member 31, the partial base member 31a is set to have the highest porosity and the partial base member 31c is set to have the lowest porosity. As a result, in the base member 31, the partial base member 31a has the lowest thermal conductivity and the partial base member 31c has the highest thermal conductivity.

Accordingly, the degree of heat dissipation is ranked in descending order as "active layer 4c", "active layer 4b" and "active layer 4a", and thus, like in Embodiment 1 or 2, a relationship represented by active layer 4c<active layer 4b<active layer 4a, is satisfied in terms of the temperature during operation, so that the temperature of the active layer 4a becomes highest. Thus, the length of the wavelength is ranked in descending order as "active layer 4a", "active layer 4b" and "active layer 4c", so that different oscillation wavelengths can be obtained from the respective active layers 4a to 4c, and this makes it possible to efficiently reduce the coherence.

Note that, it is not always required that the combination of the partial base members having different thermal conductivities have a configuration as shown in FIG. 5 in which the partial base members 31a to 31c having different properties are arranged corresponding to the respective active layers 4a to 4c. For example, as represented by a modified example shown in FIG. 6, partial base members 31d and 31e whose sectional shapes each have an inclination like a trapezoid and whose thermal conductivities are different from each other (the partial base member 31e is higher in thermal conductivity than the other), may be combined so as to be mated with each other in the thickness direction.

In this case, with respect to heat transfer paths toward the heatsink 2, in the sub-mount 3, a ratio of the heat transfer length in the partial base member 31*d* to the heat transfer length in the partial base member 31*e*, differs between the respective active layers 4*a* to 4*c*. Further, the rate of the partial base member 31*e* with the higher thermal conductivity becomes lowest at the active layer 4*a*, and the rate of the partial base member 31*e* with the higher thermal conductivity becomes highest at the active layer 4*c*. Accordingly, like in the example shown in FIG. 5, the degree of heat dissipation is ranked in descending order as "active layer 4*c*", "active layer 4*b*" and "active layer 4*a*" and thus, a relationship represented by active layer 4*c*<active layer 4*b*<active layer 4*a*, is satisfied in terms of the temperature during operation.

In the above examples, such cases are shown where the partial base members 31*a* to 31*e* use the same material (AlN) but are made different in thermal conductivity because of the change of the porosity; however, this is not limitative. For example, members whose materials originally have different thermal conductivities, such as of $Si_3N_4$ (silicon nitride), $Al_2O_3$ (alumina) and the like, may be combined. In addition, the number of partial base members and the shapes thereof may be determined arbitrarily so far as the combination thereof makes the thermal resistances from the respective active layers 4*a* to 4*c* to the heatsink 2 different from each other.

Embodiment 4

Figure 7:
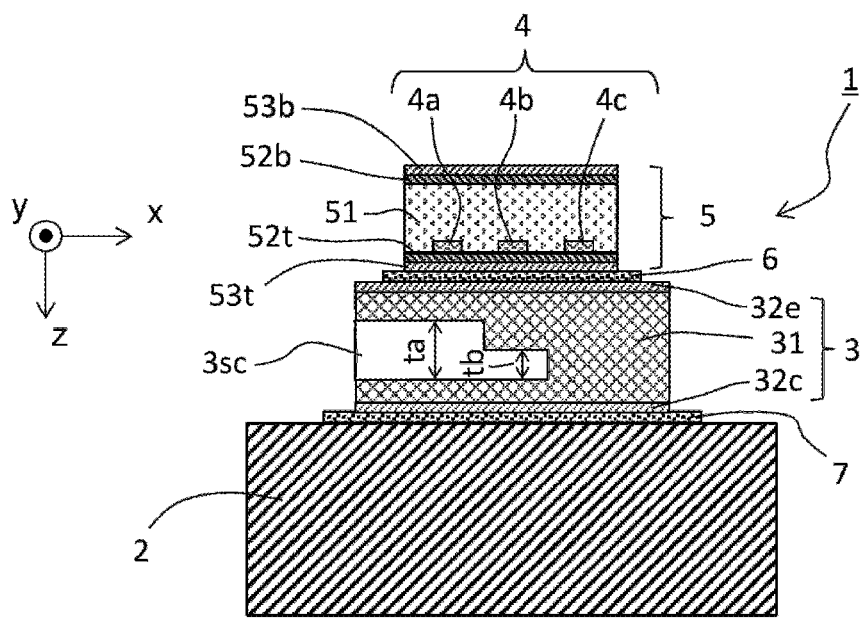
FIG. 7 is a sectional view of a semiconductor laser device perpendicular to a light traveling direction, according to Embodiment 4.

In the above Embodiment 3, a case has been described where the partial base members having different thermal conductivities are arranged in the sub-mount to thereby make the temperatures of the respective active layers different from each other. In Embodiment 4, a case will be described where a cavity which extends in the array direction is provided in a thickness-direction middle portion of a sub-mount. FIG. 7 serves to explain a configuration of a semiconductor laser device according to Embodiment 4 and is a sectional view of the semiconductor laser device perpendicular to a light traveling direction.

Also in the semiconductor laser device 1 according to Embodiment 4, as shown in FIG. 7, a semiconductor laser chip 5 is fixed to a sub-mount 3 by means of a bonding material 6 such as a solder, and the sub-mount 3 is fixed to a heatsink 2 by means of a bonding material 7 such as a solder. Here, as a characteristic configuration in Embodiment 4, a cavity 3*sc* which extends in the array direction (x-direction) and whose thickness (ta, tb) varies depending on a position relative to the active layers 4*a* to 4*c*, is created in the thickness-direction (z-direction) middle portion of the sub-mount 3.

The thickness ta of the cavity 3*sc* at a position corresponding to a straight line which connects the active layer 4*a* and the heatsink 2, is thicker than the thickness tb of the cavity 3*sc* at a position corresponding to a straight line which connects the active layer 4*b* and the heatsink 2, and the cavity 3*sc* is not placed at a position corresponding to a straight line which connects the active layer 4*c* and the heatsink 2. Because the thermal resistance is high in the region of the cavity, the degree of heat dissipation is ranked in descending order as "active layer 4*c*", "active layer 4*b*" and "active layer 4*a*" and thus, like in the foregoing respective Embodiments, a relationship represented by active layer 4*c*<active layer 4*b*<active layer 4*a*, is satisfied in terms of the temperature during operation, so that the temperature of the active layer 4*a* becomes highest. Thus, the length of the wavelength is ranked in descending order as "active layer 4*a*", "active layer 4*b*" and "active layer 4*c*", so that different oscillation wavelengths can be obtained from the respective active layers 4*a* to 4*c*, and this makes it possible to efficiently reduce the coherence.

It is noted that, although the cavity 3*sc* may be placed continuously over a length in the traveling direction (y-direction) of light from the active-layer group 4, multiple cavities may be placed along the traveling direction of light. Instead, cavities 3*sc* which have different thicknesses (z-direction) or widths (x-direction) (different shapes) depending on a position in the traveling direction of light, may be created corresponding to the respective active layers 4*a* to 4*c*. Namely, it suffices to create at least one cavity 3*sc* which extends perpendicularly to the thickness direction and have different gap thicknesses or widths (different shapes) corresponding to the respective active layers 4*a* to 4*c* or depending on a position in the array direction.

Embodiment 5

Figure 8:
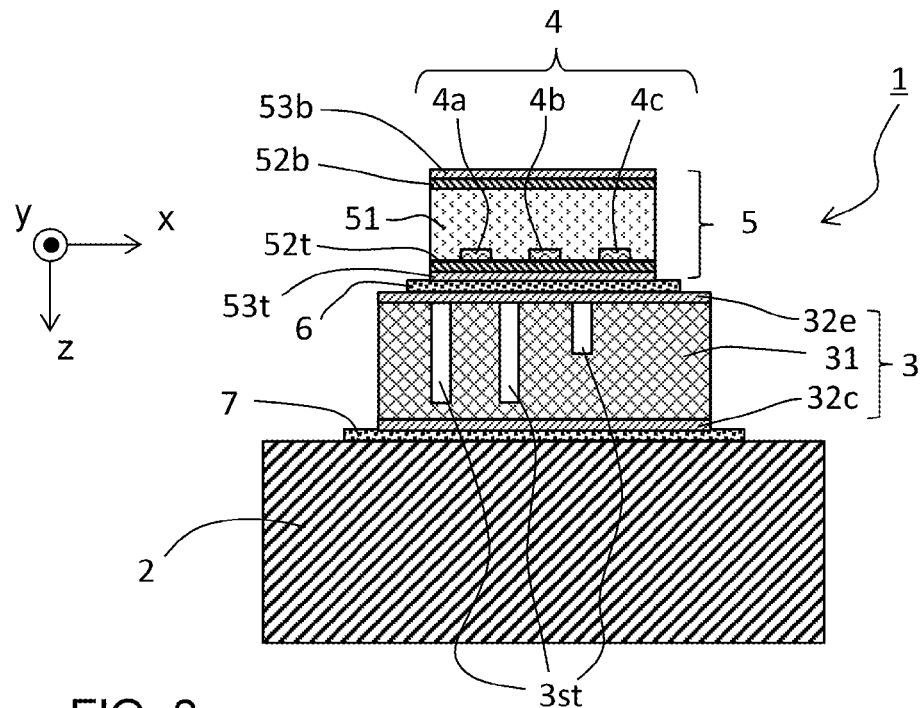
FIG. 8 is a sectional view of a semiconductor laser device perpendicular to a light traveling direction, according to Embodiment 5.
Figure 9:
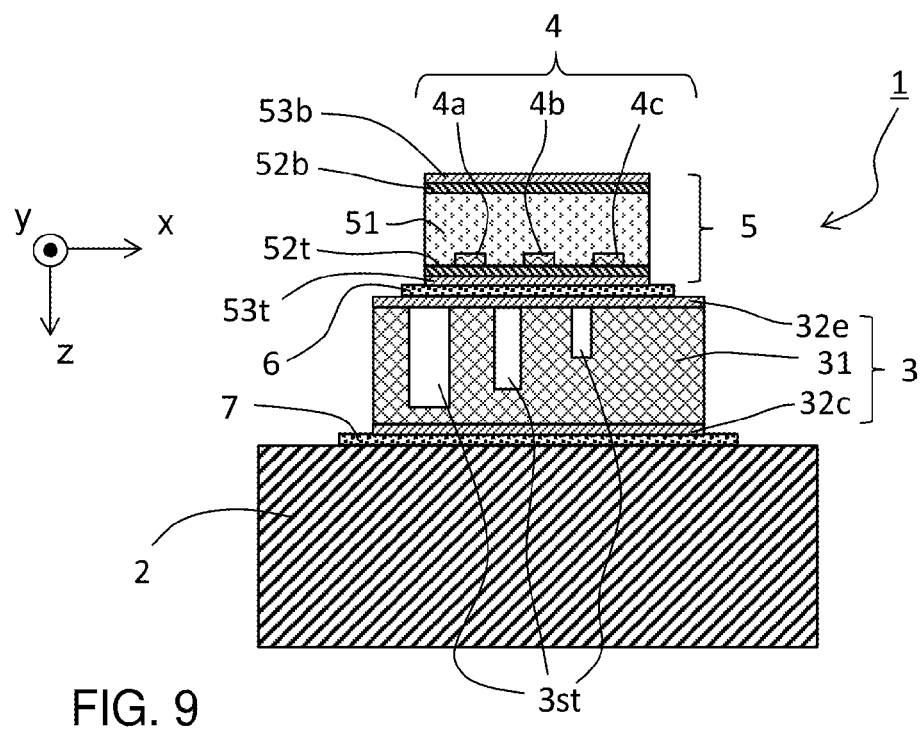
FIG. 9 is a sectional view of a semiconductor laser device perpendicular to a light traveling direction, according to a modified example of Embodiment 5.

In the above Embodiment 4, a case has been described where the cavity extending in a direction perpendicular to the thickness direction is created in the sub-mount to thereby make the temperatures of the respective active layers different from each other. In Embodiment 5, a case will be described where, in a sub-mount, cavities extending in the thickness direction are created depending on the locations of the active layers. FIG. 8 and FIG. 9 serve to explain configurations of semiconductor laser devices according to Embodiment 5, in which FIG. 8 is a sectional view of a semiconductor laser device perpendicular to a light traveling direction (corresponding to FIG. 1A), and FIG. 9 is a sectional view of a semiconductor laser device perpendicular to a light traveling direction (ditto) according to a modified example.

Also in the semiconductor laser device 1 according to Embodiment 5, as shown in FIG. 8, a semiconductor laser chip 5 is fixed to a sub-mount 3 by means of a bonding material 6 such as a solder, and the sub-mount 3 is fixed to a heatsink 2 by means of a bonding material 7 such as a solder. Here, as a characteristic configuration in Embodiment 5, in the sub-mount 3, multiple cavities 3*st* extending in the thickness direction (z-direction) are created depending on the locations of the active layers 4*a* to 4*c*.

Specifically, on the both sides of the shortest path from the active layer 4*a*, deep cavities 3*st* are created, and between the active layer 4*b* and the active layer 4*c*, a shallow cavity 3*st* is created. This causes no difference between the shortest paths from the respective active layers 4*a* to 4*c* to the heatsink 2. However, with respect to the array-direction (x-direction) sides of each of the shortest paths, the length (in the thickness direction: z-direction) of each of the cavities 3*st* on the both sides of the shortest path from the active layer 4*a* is longest, and the length of the cavity 3*st* on the both sides of the shortest path from the active layer 4*c* is shortest.

In the foregoing respective Embodiments 1 to 4, cases have been described where the temperature difference is caused due to difference between the thermal resistances at the shortest paths. However, when the area of a heat absorption source (heatsink 2) is larger than that of a heat generation source (respective active layers 4*a* to 4*c*), the flow of heat, not only along the shortest path to the heat absorption source, but also in the direction perpendicular to the shortest path, is important. In the case where, like a laser array, the heat generation sources are placed side by side in the array direction and the array-direction size of the heat generation sources and that of the heat absorption source are different from each other, the flow of heat in the array direction is important.

Because of the arrangement of the cavities 3*st*, the degree of ease of heat flow in the array direction is ranked in descending order as "active layer 4*c*", "active layer 4*b*" and "active layer 4*a*", and thus, like in the foregoing respective Embodiments, a relationship represented by active layer 4*c*<active layer 4*b*<active layer 4*a*, is satisfied in terms of the temperature during operation, so that the temperature of the active layer 4*a* becomes highest. Thus, the length of the wavelength is ranked in descending order as "active layer 4*a*", "active layer 4*b*" and "active layer 4*c*", so that different oscillation wavelengths can be obtained from the respective active layers 4*a* to 4*c*, and this makes it possible to efficiently reduce the coherence.

It is noted that the number of cavities 3*st* extending in the thickness direction, the depths thereof and the combination of the widths thereof in the array direction, may be determined arbitrarily; for example, as shown in FIG. 9, cavities 3*st* having both different depths and different widths may be provided. In addition, although each of the cavities may be placed continuously over a length in the traveling direction of light from the active-layer group 4, it may instead be a plurality of cavities placed along the traveling direction of light. Namely, it suffices to create cavities 3*st* which have different gap thicknesses or widths (different shapes) depending on a position in the array direction.

Embodiment 6

Figure 10:
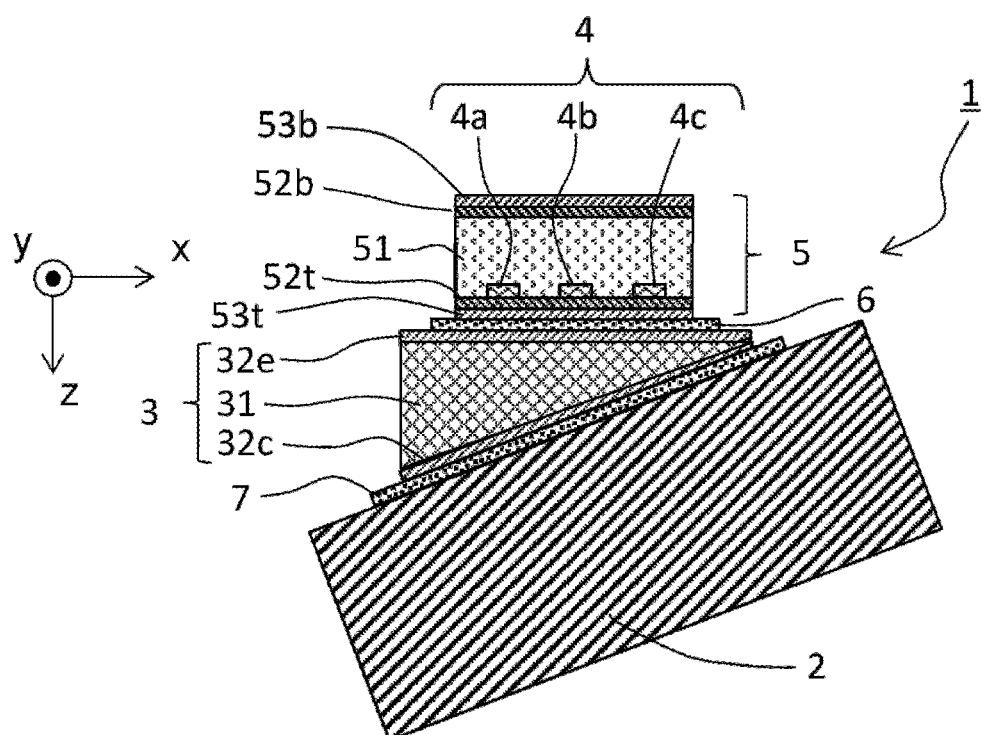
FIG. 10 is a sectional view of a semiconductor laser device perpendicular to a light traveling direction, according to Embodiment 6.

In the foregoing Embodiments 4, 5, cases have been described where an internal structure of the sub-mount makes the temperatures of the respective active layers different from each other. In Embodiment 6, a case will be described where the thickness of a sub-mount is varied in the array direction. FIG. 10 serves to explain a configuration of a semiconductor laser device according to Embodiment 6 and is a sectional view of the semiconductor laser device perpendicular to a light traveling direction (corresponding to FIG. 1A).

Also in the semiconductor laser device 1 according to Embodiment 6, as shown in FIG. 10, a semiconductor laser chip 5 is fixed to a sub-mount 3 by means of a bonding material 6 such as a solder, and the sub-mount 3 is fixed to a heatsink 2 by means of a bonding material 7 such as a solder. Here, as a characteristic configuration in Embodiment 6, such a sub-mount 3 is used whose thickness varies along the array direction. The thickness monotonically decreases from the side corresponding to the active layer 4*a* toward the side corresponding to the active layer 4*c*, so that the sectional shape perpendicular to the light traveling direction forms a triangle so that the surface on a metallization layer 32*c*-side has a constant inclination relative to the surface on a metallization layer 32*e*-side.

Accordingly, among the lengths between the respective active layers 4*a* to 4*c* and the heatsink 2, the length to the active layer 4*a* is longest, and the length to the active layer 4*c* is shortest. Thus, the degree of heat dissipation is ranked in descending order as "active layer 4*c*", "active layer 4*b*" and "active layer 4*a*", so that, like in the foregoing respective Embodiments, a relationship represented by active layer 4*c*<active layer 4*b*<active layer 4*a*, is satisfied in terms of the temperature during operation, so that the temperature of the active layer 4*a* becomes highest. Thus, the length of the wavelength is ranked in descending order as "active layer 4*a*", "active layer 4*b*" and "active layer 4*c*", so that different oscillation wavelengths can be obtained from the respective active layers 4*a* to 4*c*, and this makes it possible to efficiently reduce the coherence.

As the shape of the sub-mount in which the one surface is inclined relative to the other surface, a desired shape can be achieved easily by using, for example, a grinding or like method. Note that in this example, a case is shown where the sectional shape of the sub-mount 3 is a triangle; however, it may be a trapezoid with the opposite end also having a certain degree of thickness, so far as the thickness monotonically decreases.

It is noted that the shape in which the one surface is inclined relative to the other surface, is not necessarily a preferable shape for manufacturing the semiconductor layer device 1. In the cases of other foregoing Embodiments where a sub-mount 3 in which the one surface is parallel to the other surface is used, bonding of the heatsink 2 and the sub-mount 3 and bonding of the sub-mount 3 and the semiconductor laser chip 5 can be performed, for example, concurrently without special equipment. However, in the case where, like in the semiconductor laser device 1 according to Embodiment 6, the sub-mount 3 in which the one surface and the other surface are inclined to each other is used, when the respective bonding is to be performed concurrently in a simple way, the semiconductor laser chip 5 is placed on the inclined metallization layer 32*e*, for example. As a result, a possibility may arise that the semiconductor laser chip 5 slips down on the metallization layer 32*e* until the bonding materials 6, 7 are hardened, to cause positional displacement.

Thus, in this Embodiment, as a soldering material to be used for the bonding material 7, such a soldering material is selected whose melting point is higher than that of a soldering material to be used for the bonding material 6, and using that bonding material 7, the sub-mount 3 is once bonded to the heatsink 2. Thereafter, the heatsink 2 is placed obliquely so that the metallization layer 32*e* is directed horizontally, and then, using the bonding material 6, the semiconductor laser chip 5 is bonded at a temperature that is lower than the melting point of the bonding material 7 but is higher than the melting point of the bonding material 6. Such a member with an inclined shape is generally disinclined for use because it requires an extra effort in the manufacturing processes; however, such a sub-mount 3 can be produced by a simple method such as grinding or the like. Thus, it is possible to achieve inexpensively and easily a semiconductor laser device 1 which is highly effective for reducing the coherence.

Embodiment 7

Figure 11A:
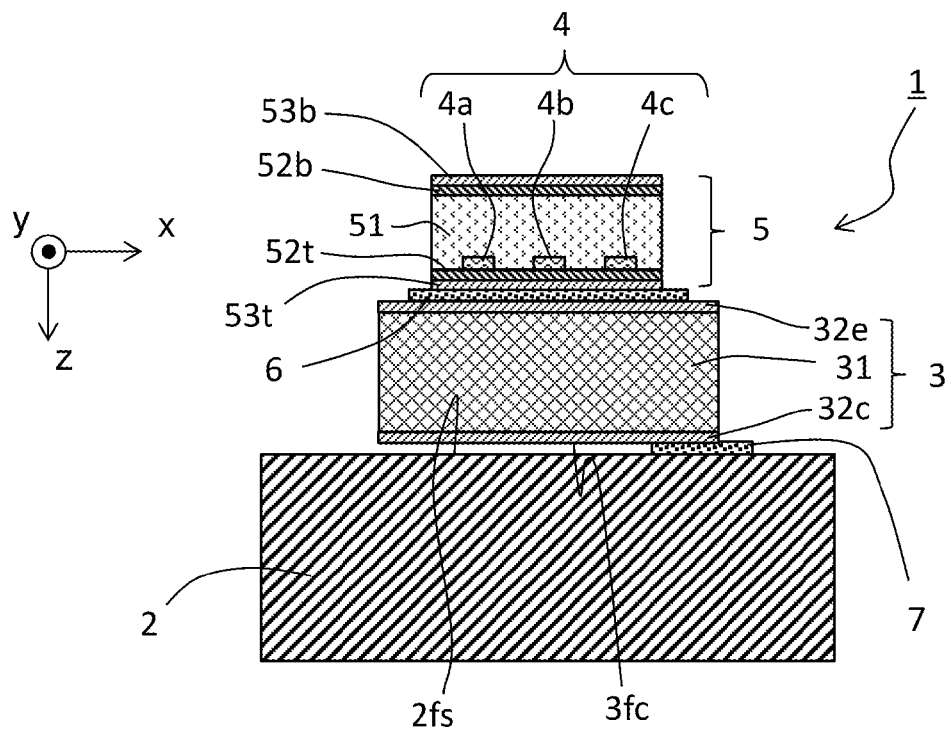
FIG. 11A and FIG. 11B are a sectional view of a semiconductor laser device perpendicular to a light traveling direction, and a plan view of a sub-mount, showing a treatment region inside its opposing surface to a heatsink, respectively, according to Embodiment 7.
Figure 11B:
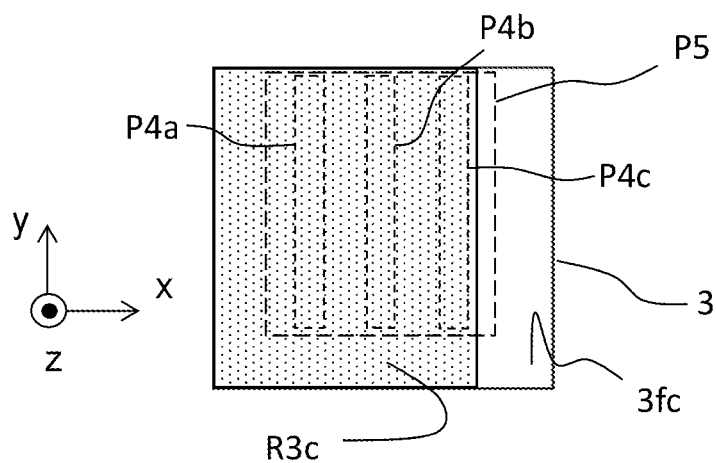
Figure 12A:
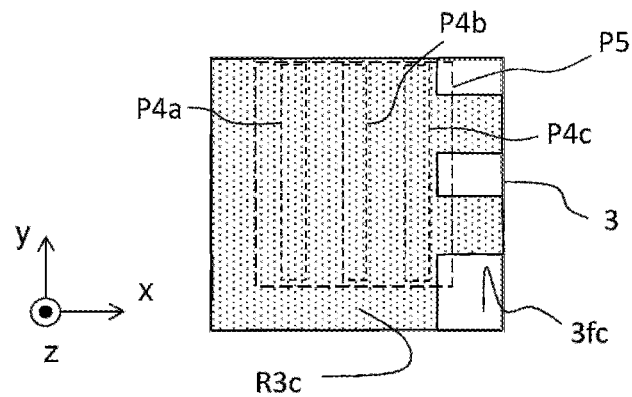
FIG. 12A and FIG. 12B are respective plan views of sub-mounts that constitute semiconductor laser devices, each showing a treatment region inside its opposing surface to a heatsink, according to two modified examples of Embodiment 7.
Figure 12B:
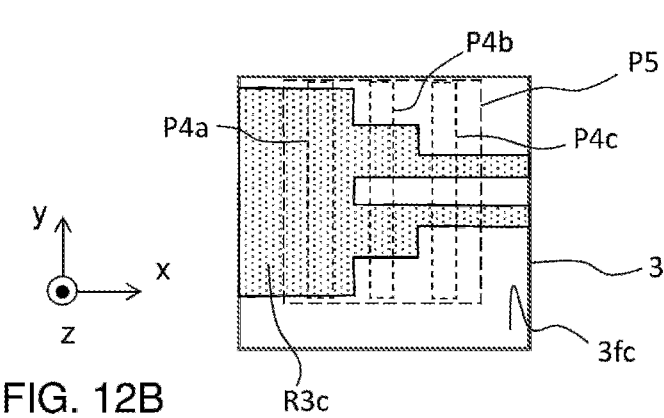

In a semiconductor laser device according to Embodiment 7, an adhered region of the bonding material onto a bonding surface between a sub-mount and a heatsink is controlled, to thereby cause temperature variation between the respective active layers. FIG. 11A and FIG. 11B serve to explain a configuration of a semiconductor laser device according to Embodiment 7, in which FIG. 11A is a sectional view of the semiconductor laser device perpendicular to a light traveling direction (corresponding to FIG. 1A) and FIG. 11B is a plan view of a sub-mount, showing a treatment region created on its opposing surface to a heatsink and having been subjected to surface treatment so as to cause a bonding material not to adhere thereto. Further, FIG. 12A and FIG. 12B shows as illustrations of two modified examples: a plan view, corresponding to FIG. 11B, of a sub-mount according to the first modified example, showing a treatment region created on its opposing surface to a heatsink and having been subjected to surface treatment so as to cause a bonding material not to adhere thereto (FIG. 12A); and a plan view, corresponding to FIG. 11B, of a sub-mount according to the second modified example, showing a treatment region created on its opposing surface to a heatsink and having been subjected to surface treatment so as to cause a bonding material not to adhere thereto (FIG. 12B).

Also in the semiconductor laser device 1 according to Embodiment 7, as shown in FIG. 11A, a semiconductor laser chip 5 is fixed to a sub-mount 3 by means of a bonding material 6 such as a solder, and the sub-mount 3 is fixed to a heatsink 2 by means of a bonding material 7 such as a solder. Here, as shown in FIG. 11B, a treatment region R3c having been subjected to surface treatment so as to cause the bonding material not to adhere thereto, is formed partially on a metallization layer 32c that constitutes an opposing surface 3fc of the sub-mount 3 to the heatsink 2. Within the opposing surface 3fc, the treatment region R3c is created to be one-sided in the array direction but corresponding to projected regions P4a to P4c of the respective active layers 4a to 4c on that surface after the semiconductor chip 5 being bonded. Specifically, the treatment region R3c is created over all of a region extending on the side where the active-layer group 4 is placed, from a line that is parallel to the traveling direction of light and that is placed at a position outside the active layer 4c but inside a projected region P5 of the semiconductor laser chip 5.

Further, assuming for example a case where an AuSn (gold-tin) solder, as shown as an exemplary bonding material 6 in Embodiment 1, is used as the bonding material 7, the surface of a portion of the metallization layer 32c other than its portion corresponding to the treatment region R3c is covered with Au, and the portion corresponding to the treatment region R3c is covered with Ni. When the heatsink 2 is bonded, using the bonding material 7, to the sub-mount 3 having the treatment region R3c as described above, at the portion other than that corresponding to the treatment region R3c, the bonding material 7 mediates between the heatsink 2 and the opposing surface 3fc to thereby establish heat transfer paths in a firm state. In contrast, since the AuSn solder is not wettable to Ni, at the portion corresponding to the treatment region R3c, no bonding relation is established between the opposing surface 3fc and the bonding material 7 (after being hardened), resulting in their state merely in contact with each other. Depending on conditions, there is also a possibility that, at any place on the portion corresponding to the treatment region R3c, a gap may occur between that portion and the bonding material 7.

In this example, the shortest paths between the respective active layers 4a to 4c and the heatsink are provided with no region where bonding is made between the bonding material 7 and the opposing surface 3fc, and are thus high in thermal resistance than a Accordingly, heat transfer along the bypassed paths that are routed through regions where the bonding material 7 and the opposing surface 3fc are bonded, becomes dominant to heat transfer along the shortest paths, so that the degree of heat dissipation through the bypassed paths greatly influences the degree of heat dissipation from each of the active layers 4a to 4c.

Because a region where bonding is established (other than the region R3c) is positioned outside the projected region P4c of the active layer 4c, the length of the bypassed path from the active layer 4a is longest and the length of the bypassed path from the active layer 4c is shortest. Accordingly, the degree of heat dissipation is ranked in descending order as "active layer 4c", "active layer 4b" and "active layer 4a" and thus, like in the foregoing respective embodiments, a relationship represented by active layer 4c<active layer 4b<active layer 4a, is satisfied in terms of the temperature during operation, so that the temperature of the active layer 4a becomes highest. Thus, the length of the wavelength is ranked in descending order as "active layer 4a", "active layer 4b" and "active layer 4c", so that different oscillation wavelengths can be obtained from the respective active layers 4a to 4c, and this makes it possible to efficiently reduce the coherence.

Note that, it is not required that the treatment region R3c be arranged so that all the regions P4a to P4c fall therewithin as shown in FIG. 11B, and, for example, the region P4c may only partly fall or may not fall therewithin so that a shortest path at a part of the active layers may become dominant. Instead, for example, as represented by the modified example shown in FIG. 12A, there may be portions along the light traveling direction on which no treatment region R3c is formed. Furthermore, as represented by the second modified example shown in FIG. 12B, the areas of portions where no treatment region R3c is formed, may be varied on a per-region basis with respect to the regions P4a to P4c. Namely, it suffices to make the location (area) of the treatment region R3c unbalanced to one side in the array direction.

Instead, the surface that is subject to the arrangement of the treatment region to which the bonding material 7 does not adhere, may be an opposing surface 2fs of the heatsink 2 to the sub-mount 3. Furthermore, the treatment region to which the bonding material 7 does not adhere, may be arranged on each of the opposing surface 2fs of the heatsink 2 and the opposing surface 3fc of the sub-mount 3. If this is the case, depending on the bonding conditions, an instance may arise where a part of the bonding material 7 sandwiched between the treatment region on the opposing surface 2fs and the treatment region R3c on the opposing surface 3fc, is lost to create a space, so that the thermal resistance becomes much higher and thus, the temperature difference can be made more significant.

Further, in the above example, a case is shown where an AuSn solder is used as the bonding material 7, the surface of the portion of the metallization layer 32c other than the portion thereof corresponding to the treatment region R3c is made of Au, and the surface of the portion corresponding to the treatment region R3c is formed of Ni (the same applies to the treatment region on the opposing surface 2fs); however, this is not limitative. For example, an Al film or an insulating film based on Si or the like, may be provided on the treatment region R3c, and the other region may be provided with Cu instead of Au. Furthermore, the surface roughness in the treatment region R3c may be made different from that in the other region. Namely, also in Embodiment 7, so long as such a material or surface condition is ensured in the treatment region R3c, unlike in the other region, that causes the bonding material 7 not to adhere or causes the bonding material 7 not to be bonded to that region, the combination of the material, the surface condition, and the type of the bonding material 7 may be determined arbitrarily.

Embodiment 8

Figure 13:
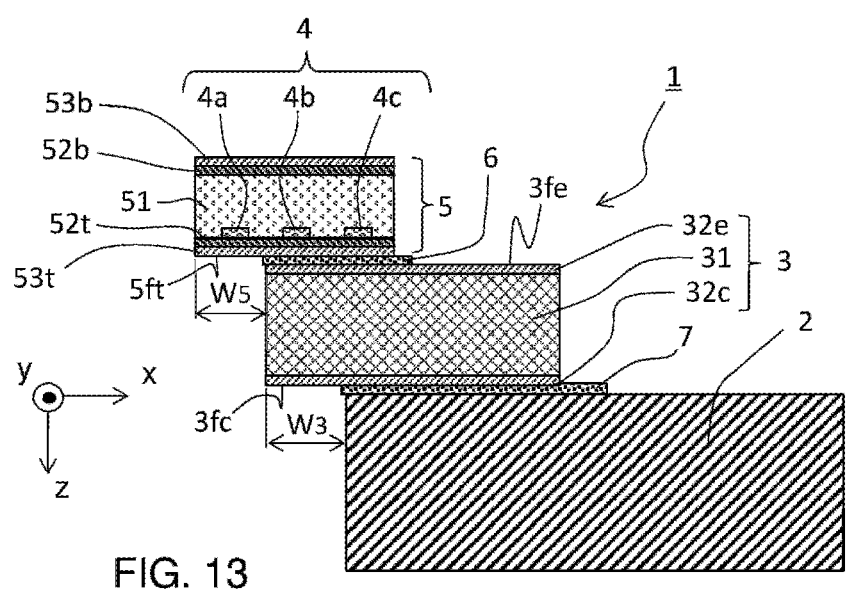
FIG. 13 is a sectional view of a semiconductor laser device perpendicular to a light traveling direction, according to Embodiment 8.

In the foregoing respective Embodiments, cases have been described where, at least one of the configurations of the semiconductor chip, the sub-mount and the heatsink, or the arrangement of the regions subject to surface treatment, makes the temperatures of the respective active layers different from each other. In Embodiment 8, a case will be described where the temperatures of the respective active layers are made different from each other depending on an array-direction positional relationship of a semiconductor laser chip, a sub-mount and a heatsink. FIG. 13 serves to explain a configuration of a semiconductor laser device according to Embodiment 8, and is a sectional view of the semiconductor laser device perpendicular to a light traveling direction (corresponding to FIG. 1A).

Also in the semiconductor laser device 1 according to Embodiment 8, as shown in FIG. 13, a semiconductor laser chip 5 is fixed to a sub-mount 3 by means of a bonding material 6 such as a solder, and the sub-mount 3 is fixed to a heatsink 2 by means of a bonding material 7 such as a solder. Here, as characteristic configurations in Embodiment 8, the semiconductor laser chip 5 is bonded to the sub-mount 3 so that it partly protrudes out of the sub-mount in the array direction (x-direction) and, in addition, the sub-mount 3 is bonded to the heatsink 2 so that it also partly protrudes out of the heatsink in the same direction.

As the result of such bonding that causes protrusions in the array direction, the sub-mount 3 that is contributory to heat dissipation is not placed just above the active layer 4a (or, a downwardly projected region thereof in the figure: corresponding to P4a). Further, just above the active layer 4b (ditto: corresponding to P4b), the sub-mount 3 is placed but the heatsink 2 is not placed. In contrast, just above the active layer 4c (ditto: corresponding to P4c), the sub-mount 3 and the heatsink 2 are both placed.

Namely, heat dissipation paths from the active layer 4a are each established due to: heat transfer in the array direction in the semiconductor laser chip 5; radiation from the opposing surface 5ft; or heat transfer to the inside of a resin that constitutes an unshown encapsulation body in which the semiconductor laser device 1 is encapsulated; and thus, there is no heat transfer path therefrom that directly communicates to the heatsink 2. Further, although the sub-mount 3 is bonded just above the active layer 4b, the heatsink 2 is not placed above the portion corresponding to the region P4b, so that heat dissipation toward the heatsink 2 requires heat transfer in the array direction in the sub-mount 3.

Accordingly, the degree of heat dissipation is ranked in descending order as "active layer 4c", "active layer 4b" and "active layer 4a" and thus, like in the foregoing respective Embodiments, a relationship represented by active layer 4c<active layer 4b<active layer 4a, is satisfied in terms of the temperature during operation, so that the temperature of the active layer 4a becomes highest. Thus, the length of the wavelength is ranked in descending order as "active layer 4a", "active layer 4b" and "active layer 4c", so that different oscillation wavelengths can be obtained from the respective active layers 4a to 4c, and this makes it possible to efficiently reduce the coherence.

It is noted that, in the above example, a protrusion amount $W_5$ of the semiconductor laser chip 5 relative to the sub-mount 3 is determined so that a portion of the semiconductor laser chip 5 matching with a region just above the active layer 4a fully protrudes out of the sub-mount 3. Furthermore, a protrusion amount $W_3$ of the sub-mount 3 relative to the heatsink 2 is determined so that a portion of the sub-mount 3 corresponding to a region just above the active layer 4b fully protrudes out of the heatsink 2. However, this is not limitative, and a portion in a region placed beneath a given one of the active layers may partly protrude out in the array direction, and the protrusion amounts $W_5$, $W_3$ may be determined arbitrarily so far as such transfer paths are established that are unbalanced depending on a position in a direction from the one-end side active layer to the other-end side active layer.

It is noted that, in the foregoing respective Embodiments, cases have been described where the number of the active layers that constitute the active-layer group 4 is three; however, the number is not limited thereto. In the foregoing respective Embodiments, at least one of a member configuration, a state of surface treatment and a positional relationship between members, is unbalanced to one side in the array direction, so that the degree of heat dissipation varies unidirectionally (decreases or improves) on a per-active-layer basis, from the one end side to the other end side in the array direction. Accordingly, if there are at least two active layers, different wavelengths will be oscillated, thus making it possible to reduce the coherence. Further, since rays of laser light with different wavelengths as many as the number of the active layers can be oscillated, there is provided no active layer that is useless for coherent reduction. Thus, it is possible to achieve inexpensively and easily a semiconductor laser device 1 which is highly effective for reducing the coherence.

On the other hand, in the case, as shown in Embodiment 1, 2 or 7, of adjusting the regions/region subject to surface treatment for reducing adhesion of the bonding material, it is possible to flexibly make region adjustment by using a masking or like technique, so that, unlike in the case of changing the member configuration or shape, the variation can be changed easily. Thus, in the case where the degree of heat dissipation is to be varied according to the distribution of the surface treatment regions, it is not necessarily required that the degrees of heat dissipation of the respective active layers be unbalanced to one side in the array direction. For example, if such a configuration is provided in which a given one of the active layers will reach the same temperature as that of another one, the wavelengths of the active layers will be partly the same, so that the effect of reducing the coherence will be diminished; however, the configuration can be accomplished easily, so that, from the overall viewpoint, it is possible to achieve inexpensively and easily a semiconductor laser device 1 which is highly effective for reducing the coherence.

It is further noted that, in this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

As described above, the semiconductor laser device 1 according to each of Embodiments 1, 2 and 7, or a combination thereof, is configured to include: the plate-like semiconductor laser chip 5 in which multiple light emitting regions (with the same specifications) (active layers 4a to 4c) each extending along a traveling direction of light (y-direction), are arrayed in order in a direction (array direction: x-direction) perpendicular to the traveling direction, with an interval therebetween; the sub-mount 3 which is bonded to the semiconductor laser chip 5; and the heatsink 2 which is bonded to the sub-mount 3 on its side (opposing surface 3fc) opposite to its side (opposing surface 3fe) where the sub-mount is bonded to the semiconductor laser chip 5; wherein, on at least one of respective opposing surfaces (opposing surface 5ft, opposing surface 3fe) of the semiconductor laser chip 5 and the sub-mount 3 and respective opposing surfaces (opposing surface 3fc, opposing surface 2fs) of the sub-mount 3 and the heatsink 2, one or more treatment regions (for example, treatment regions R5t, treatment regions R3e, treatment region R3c or the like) are provided where adhesion of a bonding material (bonding material 6 or bonding material 7) used for their bonding is reduced, said one or more treatment regions being placed to define, in the traveling direction (y-direction), different coverages depending on a position in the array direction (x-direction) of the multiple light emitting regions (active layers 4a to 4c) (in particular, in a manner corresponding to the respective regions P4a to P4c). Thus, by use of a method of so-called surface treatment by which a subject to be created can be adjusted easily, the thermal resistance at a bonded portion varies along the array direction, so that the temperatures of the active layers 4a to 4c with the same configurations can be made different from each other, to thereby make the wavelengths shifted from each other. Thus, it is possible to achieve inexpensively and easily a semiconductor laser device 1 which is highly effective for reducing the coherence.

In particular, it is possible to more surely cause the difference in thermal resistance when said one or more treatment regions are provided on each of the opposing surfaces (opposing surface 5ft and opposing surface 3fe) of the semiconductor laser chip 5 and the sub-mount 3, or on each of the opposing surfaces (opposing surface 3fc and opposing surface 2fs) of the sub-mount 3 and the heatsink 2, to be placed on their respective portions opposite to and coinciding with each other.

Further, when the bonding material 6 or the bonding material 7 is a gold-tin solder, and a layer of nickel or aluminum, or a layer of insulating film is formed on a surface of each of said one or more treatment regions, the gold-tin solder does not adhere to the that treatment regions, so that it is possible to more surely cause the difference in thermal resistance, without requirement of an unusual material.

In another aspect, the semiconductor laser device 1 according to each of foregoing respective Embodiments (in particular, each of Embodiments 3 to 6 and 8, or a combination thereof) is configured to include:
the plate-like semiconductor laser chip 5 in which multiple light emitting regions (with the same specifications) (active layers 4a to 4c) each extending along a traveling direction of light (y-direction), are arrayed in order in a direction (array direction: x-direction) perpendicular to the traveling direction, with an interval therebetween; the sub-mount 3 which is bonded to the semiconductor laser chip 5; and the heatsink 2 which is bonded to the sub-mount 3 on its side (opposing surface 3fc) opposite to its side (opposing surface 3fe) where the sub-mount is bonded to the semiconductor laser chip 5; wherein a thermal resistance in heat transfer paths that connect the respective multiple light emitting regions (active layers 4a to 4c) and the heatsink 2, monotonically decreases or mono-tonically increases as a position in an array direction (x-direction) of the multiple light emitting regions (active layers 4a to 4c) moves from one end side of that regions toward another end side. If thus configured, it is possible to cause the active layers 4a to 4c with the same configurations to have different temperatures, to thereby make the wavelengths shifted from each other. Thus, it is possible to achieve inexpensively and easily a semiconductor laser device 1 which is highly effective for reducing the coherence.

In a particular aspect, the sub-mount 3 is formed of base members (partial base members 31a to 31c) with different thermal conductivities that are placed side by side in the array direction (x-direction), so that it is possible to easily cause the thermal resistance to vary monotonically.

In another aspect, if the sub-mount 3 is formed of base members (partial base members 31d and 31e) with different thermal conductivities that are stacked in the thickness direction (z-direction), and is configured so that the thickness ratio of the thus-stacked base members varies along the array direction, it is possible to easily cause the thermal resistance to vary monotonically.

Furthermore, if the sub-mount 3 is configured so that the thickness thereof varies along the array direction, it is possible by a simple method such as grinding or the like, to easily cause the thermal resistance to vary monotonically.

In another aspect, the sub-mount 3 is configured so that: at least one cavity 3sc is created therein which travels in a thickness-direction middle portion of the sub-mount and in parallel to the opposing surface 3fe thereof to the semiconductor laser chip 5; or cavities 3st are created therein which travel from the opposing surface 3fe to the semiconductor laser chip 5, toward the surface (opposing surface 3fc) of the sub-mount on the opposite side, in the portions of the sub-mount corresponding to intermediate regions developed between the respective projected areas P4a to P4c of the multiple light emitting regions (active layers 4a to 4c), and which also extend along the traveling direction of light; wherein said at least one cavity or said cavities have different shapes depending on a position in the array direction. If thus configured, because of the prevention of heat transfer in the lateral direction (in the x-y plane) in the sub-mount 3, or because of the bypassed heat path therein, it is possible to easily cause the thermal resistance to vary monotonically.

In another aspect, to the sub-mount 3, the semiconductor laser chip 5 is bonded at a displaced position where the one end side protrudes out of the sub-mount, and, to the heatsink 2, the sub-mount 3 is bonded at a displaced position where it partly protrudes out of the heatsink toward the one end side. If thus configured, it is possible, by merely adjusting the bonded positions, to easily cause the thermal resistance to vary monotonically, without changing the configurations of the members themselves.

DESCRIPTION OF REFERENCE NUMERALS AND SIGNS

1: semiconductor laser device, 2: heatsink, 2fs: opposing surface, 3: sub-mount, 31: base member, 31a to 31e: partial base members, 32c, 32e: metallization layer, 3fc: opposing surface, 3fe: opposing surface, 3sc: cavity, 3st: cavity, 4: active-layer group, 4a to 4c: active layers (light emitting regions), 5: semiconductor laser chip, 5ft: opposing surface, 51: stack, 52b: lower electrode, 52t: upper electrode, 53b, 53t: plating layer, 6, 7: bonding material, P4a to P4b: regions, R3c: treatment region, R3e: treatment region, R5t: treatment region, $W_3$: protrusion amount: $W_5$: protrusion amount.

The invention claimed is:

1. A semiconductor laser device, comprising:
a plate-like semiconductor laser chip in which multiple light emitting regions each extending along a traveling direction of light are arrayed in order in a direction perpendicular to the traveling direction, with an interval therebetween;
a sub-mount which is bonded to the semiconductor laser chip; and
a heatsink which is bonded to the sub-mount on its side opposite to its side where the sub-mount is bonded to the semiconductor laser chip;
wherein, on at least one of respective opposing surfaces of the semiconductor laser chip and the sub-mount and respective opposing surfaces of the sub-mount and the heatsink, one or more treatment regions are provided where adhesion of a bonding material used for their bonding is reduced, said one or more treatment regions being placed to define, in the traveling direction, different coverages depending on a position in an array direction of the multiple light emitting regions.

2. The semiconductor laser device of claim 1, wherein said one or more treatment regions are provided on each of the opposing surfaces of the semiconductor laser chip and the sub-mount, or on each of the opposing surfaces of the sub-mount and the heatsink, to be placed on their respective portions opposite to and coinciding with each other.

3. The semiconductor laser device of claim 1, wherein the bonding material is a gold-tin solder, and wherein a layer of nickel or aluminum, or a layer of insulating film is formed on a surface of each of said one or more treatment regions.

4. The semiconductor laser device of claim 2, wherein the bonding material is a gold-tin solder, and wherein a layer of nickel or aluminum, or a layer of insulating film is formed on a surface of each of said one or more treatment regions.

5. A semiconductor laser device, comprising:
a plate-like semiconductor laser chip in which multiple light emitting regions each extending along a traveling direction of light are arrayed in order in a direction perpendicular to the traveling direction, with an interval therebetween;
a sub-mount which is bonded to the semiconductor laser chip; and
a heatsink which is bonded to the sub-mount on its side opposite to its side where the sub-mount is bonded to the semiconductor laser chip;
wherein a thermal resistance in heat transfer paths that connect the respective multiple light emitting regions and the heatsink, monotonically decreases or monotonically increases as a position in an array direction of the multiple light emitting regions moves from one end side of that regions toward another end side thereof.

6. The semiconductor laser device of claim 5, wherein the sub-mount is formed of base members with different thermal conductivities that are placed side by side in the array direction.

7. The semiconductor laser device of claim 5, wherein the sub-mount is formed of base members with different thermal conductivities that are stacked in a thickness direction, and wherein a thickness ratio of the thus-stacked base members varies along the array direction.

8. The semiconductor laser device of claim 5, wherein a thickness of the sub-mount varies along the array direction.

9. The semiconductor laser device of claim 6, wherein a thickness of the sub-mount varies along the array direction.

10. The semiconductor laser device of claim 7, wherein a thickness of the sub-mount varies along the array direction.

11. The semiconductor laser device of claim 5, wherein, in the sub-mount,
at least one cavity is created which travels in a thickness-direction middle portion of the sub-mount and in parallel to an opposing surface thereof to the semiconductor laser chip; or
cavities are created which travel from the opposing surface of the sub-mount to the semiconductor laser chip, toward a surface of the sub-mount on an opposite side, in portions of the sub-mount corresponding to intermediate regions developed between projected regions of the respective multiple light emitting regions, and which also extend along the traveling direction of light,
said at least one cavity or said cavities having different shapes depending on a position in the array direction.

12. The semiconductor laser device of claim 6, wherein, in the sub-mount,
at least one cavity is created which travels in a thickness-direction middle portion of the sub-mount and in parallel to an opposing surface thereof to the semiconductor laser chip; or
cavities are created which travel from the opposing surface of the sub-mount to the semiconductor laser chip, toward a surface of the sub-mount on an opposite side, in portions of the sub-mount corresponding to intermediate regions developed between projected regions of the respective multiple light emitting regions, and which also extend along the traveling direction of light,
said at least one cavity or said cavities having different shapes depending on a position in the array direction.

13. The semiconductor laser device of claim 7, wherein, in the sub-mount,
at least one cavity is created which travels in a thickness-direction middle portion of the sub-mount and in parallel to an opposing surface thereof to the semiconductor laser chip; or
cavities are created which travel from the opposing surface of the sub-mount to the semiconductor laser chip, toward a surface of the sub-mount on an opposite side, in portions of the sub-mount corresponding to intermediate regions developed between projected regions of the respective multiple light emitting regions, and which also extend along the traveling direction of light,
said at least one cavity or said cavities having different shapes depending on a position in the array direction.

14. The semiconductor laser device of claim 5, wherein, to the sub-mount, the semiconductor laser chip is bonded at a displaced position where the one end side protrudes out of the sub-mount, and, to the heatsink, the sub-mount is bonded at a displaced position where it partly protrudes out of the heatsink toward the one end side.

15. The semiconductor laser device of claim 6, wherein, to the sub-mount, the semiconductor laser chip is bonded at a displaced position where the one end side protrudes out of the sub-mount, and, to the heatsink, the sub-mount is bonded at a displaced position where it partly protrudes out of the heatsink toward the one end side.

16. The semiconductor laser device of claim 7, wherein, to the sub-mount, the semiconductor laser chip is bonded at a displaced position where the one end side protrudes out of the sub-mount, and, to the heatsink, the sub-mount is bonded at a displaced position where it partly protrudes out of the heatsink toward the one end side.

17. The semiconductor laser device of claim 8, wherein, to the sub-mount, the semiconductor laser chip is bonded at a displaced position where the one end side protrudes out of the sub-mount, and, to the heatsink, the sub-mount is bonded at a displaced position where it partly protrudes out of the heatsink toward the one end side.

18. The semiconductor laser device of claim 11, wherein, to the sub-mount, the semiconductor laser chip is bonded at a displaced position where the one end side protrudes out of the sub-mount, and, to the heatsink, the sub-mount is bonded at a displaced position where it partly protrudes out of the heatsink toward the one end side.

* * * * *